(12) United States Patent
Son et al.

(10) Patent No.: US 11,631,606 B2
(45) Date of Patent: Apr. 18, 2023

(54) SUBSTRATE STORAGE APPARATUS AND APPARATUS FOR PROCESSING SUBSTRATE USING THE SAME

(71) Applicant: SEMES Co., Ltd., Chungcheongnam-do (KR)

(72) Inventors: Duk Hyun Son, Chungcheongnam-do (KR); Je Ho Kim, Gyeonggi-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 833 days.

(21) Appl. No.: 16/538,067

(22) Filed: Aug. 12, 2019

(65) Prior Publication Data

US 2020/0105565 A1    Apr. 2, 2020

(30) Foreign Application Priority Data

Sep. 28, 2018   (KR) .......................... 10-2018-0116507

(51) Int. Cl.
*H01L 21/677* (2006.01)
*H01L 21/67* (2006.01)
(Continued)

(52) U.S. Cl.
CPC .......... *H01L 21/67769* (2013.01); *B08B 5/02* (2013.01); *H01L 21/67034* (2013.01); *H01L 21/67386* (2013.01)

(58) Field of Classification Search
CPC ......... H01L 21/67769; H01L 21/67034; H01L 21/67386; H01L 21/67393; H01L 21/67303; H01L 21/67028; H01L 21/67389; H01L 21/67017; H01L 21/67379; H01L 21/67772; B08B 5/02
See application file for complete search history.

(56) References Cited

U.S. PATENT DOCUMENTS 9,666,454 B2    5/2017  Choi et al.
2019/0311929 A1  10/2019  Woo et al.

FOREIGN PATENT DOCUMENTS

KR       20130106543 A     9/2013
KR       101448131 B1    10/2014
(Continued)

OTHER PUBLICATIONS

Korean Grant of Patent for Korean Application No. 10-2018-0116507, dated Sep. 9, 2020, with translation, 3 pages.
(Continued)

*Primary Examiner* — Ermias T Woldegeorgis
(74) *Attorney, Agent, or Firm* — RatnerPrestia

(57) ABSTRACT

Provided are a substrate storage apparatus and a substrate processing apparatus using the substrate storage apparatus. The substrate storage apparatus includes a housing having a loading/unloading port for loading/unloading of a substrate and configured to provide a loading space for a loaded substrate, a separation membrane coupled to the housing to divide the loading space into a plurality of separation spaces isolated from each other, a gas supplier configured to supply a purge gas into the loading space to clean the substrate, a gas discharger configured to discharge the purge gas accommodated in the loading space, and a controller configured to control supply and discharge of the purge gas for each of the plurality of separation spaces.

20 Claims, 13 Drawing Sheets

(51) Int. Cl.
*B08B 5/02* (2006.01)
*H01L 21/673* (2006.01)

(56) References Cited

FOREIGN PATENT DOCUMENTS

| KR | 20150087069 A | | 7/2015 | | |
|----|---------------|---|--------|---|---|
| KR | 20150087703 A | * | 7/2015 | ....... | H01L 21/67017 |
| KR | 20150087703 A | | 7/2015 | | |
| KR | 101729754 B1 | | 5/2017 | | |
| KR | 20180005489 A | * | 1/2018 | ....... | H01L 21/67383 |
| KR | 20180005489 A | | 1/2018 | | |
| KR | 20180046272 A | | 5/2018 | | |

OTHER PUBLICATIONS

Korean Office Action for Korean Application No. 10-2018-0116507, dated Apr. 1, 2020, 8 pages.

* cited by examiner

SUBSTRATE STORAGE APPARATUS AND APPARATUS FOR PROCESSING SUBSTRATE USING THE SAME

CROSS REFERENCE TO RELATED APPLICATION

This application claims priority from Korean Patent Application No. 10-2018-0116507 filed on Sep. 28, 2018 in the Korean Intellectual Property Office, the disclosure of which is incorporated herein by reference in its entirety.

BACKGROUND

1. Field of the Disclosure

The present disclosure relates to a substrate storage apparatus and an apparatus for processing a substrate using the same.

2. Description of the Related Art

When manufacturing a semiconductor device or a display device, various processes such as photolithography, etching, ashing, ion implantation, thin film deposition, cleaning, and the like are performed. The photolithography process includes a coating process, an exposure process, and a developing process. A photoresist is applied onto a substrate (i.e., coating process), a circuit pattern is exposed on the substrate formed with a photoresist film (i.e., exposure process), and an exposed area of the substrate is selectively developed (i.e., developing process).

Various processes may be performed in one type of processing equipment. To this end, the equipment may include a plurality of process modules performing different processes. The substrate on which the process has been completed may be taken out of the equipment and transferred to another type of processing equipment while being accommodated in a carrier.

As the process progresses in the process module, foreign substances may adhere to the substrate. Thus, the substrate on which the process has been completed may be loaded on a side storage to remove the foreign substances and then accommodated in the carrier. In addition, the substrate may be loaded on the side storage to remove the foreign substances before the process is performed.

SUMMARY

Aspects of the present disclosure provide a substrate storage apparatus for efficiently removing foreign substances from substrates having mutually different states and an apparatus for processing the substrates using the same.

It should be noted that objects of the present invention are not limited to the above-described objects, and other objects of the present invention will be apparent to those skilled in the art from the following descriptions.

According to an aspect of the present disclosure, there is provided a substrate storage apparatus including: a housing having a loading/unloading port for loading/unloading a substrate and configured to provide a loading space for a loaded substrate; a separation membrane coupled to the housing to divide the loading space into a plurality of separation spaces isolated from each other; a gas supplier configured to supply a purge gas to the loading space to clean the substrate; a gas discharger configured to discharge the purge gas accommodated in the loading space; and a controller configured to control supply and discharge of the purge gas for each of the plurality of separation spaces.

The separation membrane may divide the loading space into an upper space and a lower space.

The separation membrane may be attachable to or detachable from the housing.

Each of the plurality of separation spaces may accommodate substrates that are subjected to the same process or are in the same state.

A plurality of gas suppliers and a plurality of gas dischargers may be provided for each of the plurality of separation spaces, and the controller may individually control the plurality of gas suppliers and the plurality of gas dischargers provided for each of the plurality of separation spaces.

The controller may control the plurality of gas suppliers and the plurality of gas dischargers through one of a filling mode, in which each of the plurality of separation spaces is kept filled with the purge gas, and an exhaust mode, in which each of the plurality of separation spaces is exhausted so that a gas flow may be formed for the plurality of separation spaces.

The controller may implement the filling mode or the exhaust mode by adjusting the number of operations of the plurality of gas suppliers and the number of operations of the plurality of gas dischargers provided in each of the plurality of separation spaces.

The gas suppliers may include a first supplier and a second supplier, and the controller may control such that the purge gas is supplied through the first supplier and the second supplier in the filling mode, and the purge gas is supplied through the first supplier in a state in which supply of the purge gas through the second supplier is blocked in the exhaust mode.

The first supplier may be located closer to the loading/unloading port than the second supplier.

Each of the first supplier and the second supplier may include a gas supply line configured to provide a transfer path of the purge gas supplied to the loading space, a gas supply valve configured to adjust an amount of the purge gas transferred along the gas supply line, and a spray nozzle configured to spray the purge gas transferred through the gas supply line into the loading space.

The gas discharger may include a first discharger and a second discharger, and the controller may control such that the purge gas is exhausted through the first discharger and the second discharger in the exhaust mode, and the purge gas is discharged through the first discharger in a state in which discharge of the purge gas through the second discharger is blocked in the filling mode.

The first discharger may be located closer to the loading/unloading port than the second discharger.

Each of the first discharger and the second discharger may include a gas discharge line configured to provide a transfer path of the purge gas discharged from the loading space, a gas discharge valve configured to adjust an amount of the purge gas transferred along the gas discharge line, and a discharge port configured to collect the purge gas accommodated in the loading space to guide the purge gas to the gas discharge line.

The gas discharger may further include a third discharger, discharge ports of the first discharger and the second discharger may be disposed on an upper surface or a lower surface of the separation space, and a discharge port of the third discharger may be disposed on a rear surface of the separation space.

According to one aspect of the present disclosure, there is provided a substrate processing apparatus, which includes a process module having at least one process unit and configured to perform a manufacturing process on an input substrate; an index module configured to insert a substrate into the process module and eject the substrate on which the manufacturing process is completed in the process module; and a substrate storage apparatus configured to perform a cleaning operation by loading the substrate inserted into the process module or the substrate ejected from the process module, wherein the substrate storage apparatus includes a plurality of separation spaces for separating and loading substrates having mutually different states.

The substrate storage apparatus may include a housing configured to provide a loading space for the substrate; and a separation membrane coupled to the housing to divide the loading space into the plurality of separation spaces.

The separation membrane may divide the loading space into an upper space and a lower space.

The separation membrane may be attachable to or detachable from the housing.

Each of the plurality of separation spaces may accommodate substrates that are subjected to the same process or are in the same state.

The substrate storage apparatus may include: a gas supplier configured to supply a purge gas into the loading space to clean the substrate; a gas discharger configured to discharge the purge gas accommodated in the loading space; and a controller configured to control supply and discharge of the purge gas for each of the plurality of separation spaces.

The controller may control the plurality of gas suppliers and the plurality of gas dischargers through one of a filling mode, in which each of the plurality of separation spaces is kept filled with the purge gas, and an exhaust mode, in which each of the plurality of separation spaces is exhausted so that a gas flow is formed for the plurality of separation spaces.

The substrate storage apparatus may include a side storage.

The specific details of other embodiments are included in the detailed description and drawings.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
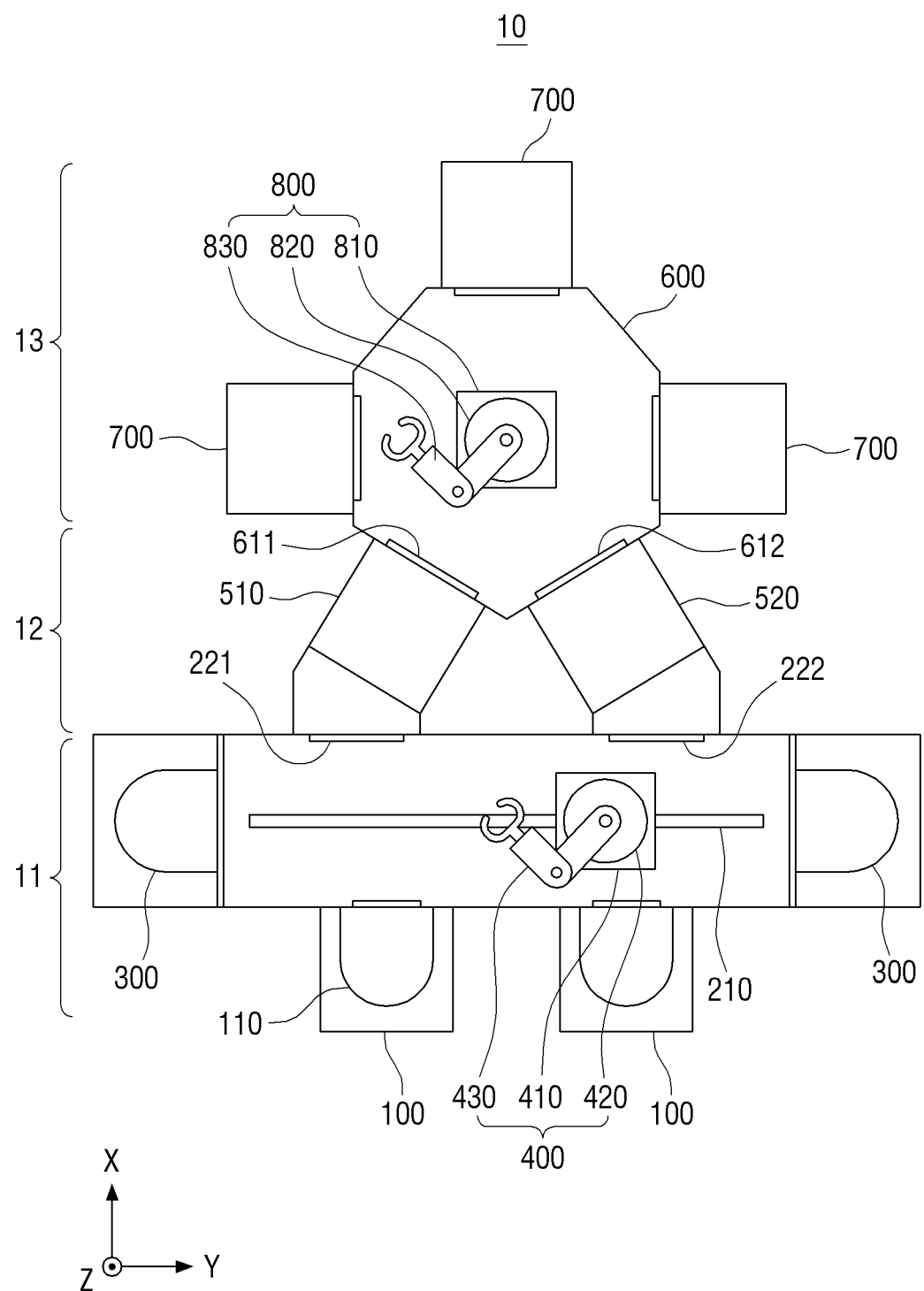
FIG. 1 is a view illustrating a substrate processing apparatus according to an embodiment of the present disclosure.

Hereinafter, a preferred embodiment of the present disclosure will be described in detail with reference to the accompanying drawings. Advantages and features and methods of achieving the advantages and features will be apparent with reference to the embodiments described in detail below with reference to the accompanying drawings. However, the present disclosure is not limited to the embodiments as described below, and it may be implemented in various different forms. The embodiments are provided to complete the present disclosure and clearly inform of the scope of the present disclosure to those skilled in the art, and therefore, the present disclosure will be defined only by the scope of claims. The same reference numerals refer to the same elements throughout the specification.

It is to be understood that when elements or layers are referred to as being "on" another element or layer, it may be directly on another element or layer or an intervening element or intervening layer may also be present. Meanwhile, when an element is being referred to as being "directly on" or "directly above" another element or layer, an intervening element or intervening layer may not be present.

The spatially relative terms "below," "beneath," "lower," "above," "upper" and the like may be used to readily describe the correlation between a device or components and other devices or components shown in the drawings. The spatially relative terms should be understood to include different orientations of the device during use or operation, in addition to the orientation shown in the drawings. For example, when an element shown in the drawings is turned over, an element described as being "below" or "beneath" another element may be placed "above" another element. Thus, the exemplary term "below" may include both downward and upward directions. The elements may also be oriented in different directions so that the spatially relative terms may be interpreted based on the orientation.

Although the terms such "first" or "second" may be used herein to describe various elements, components and/or sections, the elements, the components and/or the sections should not be limited by the terms. The terms are only used to distinguish one element, component, or section from another element, component, or section. Therefore, a first element, a first component, or a first section, which will be described below, may be a second element, a second component, or a second section without departing from the spirit of the present disclosure.

The terms used herein are for the purpose of illustrating embodiments and the present disclosure is not limited thereto. In the specification, a singular form includes a plural form unless the context is particularly stated otherwise. The term "comprises" and/or "comprising" used herein specifies the presence of components, steps, operations, and/or elements, and it is not intended to exclude the presence or addition of other components, steps, operations, and/or elements.

Unless defined otherwise, all terms (including technical and scientific terms) used herein may be used with the meaning which can be commonly understood by those skilled in the art. In addition, commonly-used terms, which are defined in a dictionary, should not be ideally or excessively interpreted unless explicitly defined otherwise.

Hereinafter, embodiments of the present disclosure will be described in detail with reference to the accompanying drawings, wherein like reference numerals refer to the like elements and detailed description thereof will be omitted in order to avoid redundancy.

FIG. 1 is a view illustrating a substrate processing apparatus according to an embodiment of the present disclosure.

Referring to FIG. 1, a substrate processing apparatus 10 includes an index module 11, a loading module 12, and a process module 13.

The index module 11, the loading module 12, and the process module 13 may be disposed in a line. In the following description, a direction in which the index module 11, the loading module 12, and the process module 13 are disposed will be referred to as a first direction X, a direction perpendicular to the first direction X when viewed from the top will be referred to as a second direction Y, and a direction perpendicular to a plane including the first direction X and the second direction Y will be referred to as a third direction Z.

The index module 11 inserts a substrate into the process module 13 and ejects the substrate from the process module 13 when the manufacturing process for the substrate is completed in the process module 13. The loading module 12 may be provided between the index module 11 and the process module 13. The index module 11 may insert the substrate into the process module 13 through the loading module 12 or eject the substrate from the loading module 12.

The index module 11 may transfer the substrate from a carrier 110 in which the substrate is accommodated, to the loading module 12 and accommodate the substrate discharged from the loading module 12 into the carrier 110. The index module 11 may include a load port 100, a transfer frame 200, and a substrate storage apparatus 300.

The carrier 110 may be seated on the load port 100. A plurality of substrates may be accommodated in the carrier 110. A plurality of load ports 100 may be provided and the plurality of load ports 100 may be disposed in a line in the second direction Y.

The carrier 110 may include a slot (not shown) for supporting an edge of the substrate. A plurality of slots may be provided along the third direction Z. Thus, the plurality of substrates may be stacked inside the carrier 110 while being spaced apart from each other in the third direction Z. A front opening unified pod (FOUP) may be used as the carrier 110.

The transfer frame 200 may serve to transfer the substrate between the carrier 110, the substrate storage apparatus 300, and the loading module 12. The transfer frame 200 may include an index rail 210 and an index robot 400.

The index rail 210 may be disposed long in parallel to the second direction Y. The index robot 400 is installed on the index rail 210 and is movable in the second direction Y along the index rail 210. The index robot 400 may include an index base 410, an index body 420, and an index arm 430. The index base 410 may be installed on the index rail 210 such that the index base 410 may move along the index rail 210. The index body 420 may be coupled to the index base 410 and move along the index rail 210 together with the index base 410. In addition, the index body 420 may move in the third direction Z with respect to the index base 410 and may rotate about a rotational axis parallel to the third direction Z.

The index arm 430 directly supports the substrate to transfer the substrate. For this purpose, the index arm 430 may include a plurality of joints capable of adjusting an angle or a length with respect to each other. Although FIG. 1 shows one index arm 430 provided on the index body 420, a plurality of index arms 430 may be provided on the index body 420. When the plurality of index arms 430 are provided, some of the plurality of index arms 430 may be used to transfer the substrate from the loading module 12 to the carrier 110 and remaining index arms 430 may be used to transfer the substrate from the carrier 110 to the loading module 12. Since the plurality of index arms 430 perform the transfer operations different from each other, particles generated in the substrate before the process may be prevented from adhering to the substrate after the process.

The substrate storage apparatus 300 may serve to temporarily store the substrates processed in the process module 13. In addition, the substrate storage apparatus 300 may perform a cleaning operation on the substrate. The cleaning operation may include an operation of removing the fume attached to a surface of the substrate and an operation of drying the substrate.

A plurality of substrate storage apparatuses 300 may be provided. For example, two substrate storage apparatuses 300 may be provided and disposed on both sides of the transfer frame 200. Alternatively, only one substrate storage apparatus 300 may be disposed on one side of the transfer frame 200.

The loading module 12 may be disposed between a transfer chamber 600 of the process module 13 and the transfer frame 200. The loading module 12 may provide a space where the substrate stays before the substrate is transferred between the transfer chamber 600 and the transfer frame 200. The loading module 12 may include a load lock chamber 510 and an unload lock chamber 520. The load lock chamber 510 and the unload lock chamber 520 may be configured such that an atmosphere of an internal space thereof may be switched to a vacuum atmosphere or an atmospheric pressure atmosphere.

The load lock chamber 510 may serve to temporarily accommodate the substrate transferred from the index module 11 to the process module 13. The index module 11 and the process module 13 may be provided with doors 221 and 611 with the load lock chamber 510 interposed therebetween. Hereinafter, the door provided in the index module 11 will be referred to as a first index door 221 and the door provided in the process module 13 will be referred to as a first transfer door 611.

When the substrate is loaded into the load lock chamber 510, the first index door 221 and the first transfer door 611 are closed and the internal space of the load lock chamber 510 is sealed with respect to the index module 11 and the process module 13. After being sealed, the internal space of the load lock chamber 510 may be switched from the atmospheric pressure atmosphere to the vacuum atmosphere. In addition, in a state in which the first index door 221 is closed, the first transfer door 611 is opened so that the substrate of the load lock chamber 510 may be unloaded and transferred to the transfer chamber 600.

The unload lock chamber 520 may serve to temporarily accommodate the substrate transferred from the process module 13 to the index module 11. The index module 11 and the process module 13 may be provided with doors 222 and 612 with the unload lock chamber 520 interposed therebetween. Hereinafter, the door provided in the index module 11 will be referred to as a second index door 222, and the door provided in the process module 13 will be referred to as a second transfer door 612.

When the substrate is loaded into the unload lock chamber 520, the second index door 222 and the second transfer door 612 are closed and the internal space of the unload lock chamber 520 is sealed with respect to the index module 11 and the process module 13. After being sealed, the internal space of the unload lock chamber 520 may be switched from the vacuum atmosphere to the atmospheric pressure atmosphere. In addition, in a state in which the second transfer door 612 is closed, the second index door 222 is opened so that the substrate of the unload lock chamber 520 may be unloaded and transferred to the index module 11.

The process module 13 may include the transfer chamber 600 and a process unit 700. A plurality of process units 700 may be provided.

The transfer chamber 600 may provide a space for relaying the substrate between the load lock chamber 510, the unload lock chamber 520, and the process unit 700. For this purpose, the load lock chamber 510, the unload lock chamber 520, and the process unit 700 may be disposed along an edge of the transfer chamber 600. FIG. 1 shows the load lock chamber 510, the unload lock chamber 520, and three process units 700 disposed along the edge of the transfer chamber 600 having a pentagonal shape. However, the shape of the transfer chamber 600 of the present disclosure may not be limited to the pentagonal shape, and the shape of the transfer chamber 600 may vary depending on the number of the process units 700.

A transfer robot 800 may be provided inside the transfer chamber 600. The transfer robot 800 may serve to transfer the substrate between the load lock chamber 510, the unload lock chamber 520, and the process unit 700. For example, the transfer robot 800 may move the substrate unloaded from the load lock chamber 510 in order to load the substrate into the process unit 700 and move the substrate unloaded from the process unit 700 in order to load the substrate into the unload lock chamber 520.

The transfer robot 800 may include a transfer base 810, a transfer body 820, and a transfer arm 830. The transfer base 810 may be disposed at the center of the transfer chamber 600. The transfer body 820 may move in the third direction Z with respect to the transfer base 810 and may rotate about a rotational axis parallel to the third direction Z.

The transfer arm 830 directly supports the substrate to transfer the substrate. For this purpose, the transfer arm 830 may include a plurality of joints capable of adjusting an angle or a length with respect to each other. Thus, the transfer arm 830 may move in parallel to a plane including the first direction X and the second direction Y. Although FIG. 1 illustrates one transfer arm 830 provided in the transfer body 820, a plurality of transfer arms 830 may be provided in the transfer body 820. When the plurality of transfer arms 830 are provided, some of the plurality of transfer arms 830 may be used to transfer the substrate from the load lock chamber 510 to the process unit 700, and remaining transfer arms 830 may be used to transfer the substrate from the process unit 700 to the load lock chamber 510.

The process unit 700 may perform a specific operation on the substrate. For example, the process unit 700 may perform an etching or deposition process on the substrate. The process module 13 may include a plurality of process units 700, and each process unit 700 may perform the same or different operations.

Figure 2:
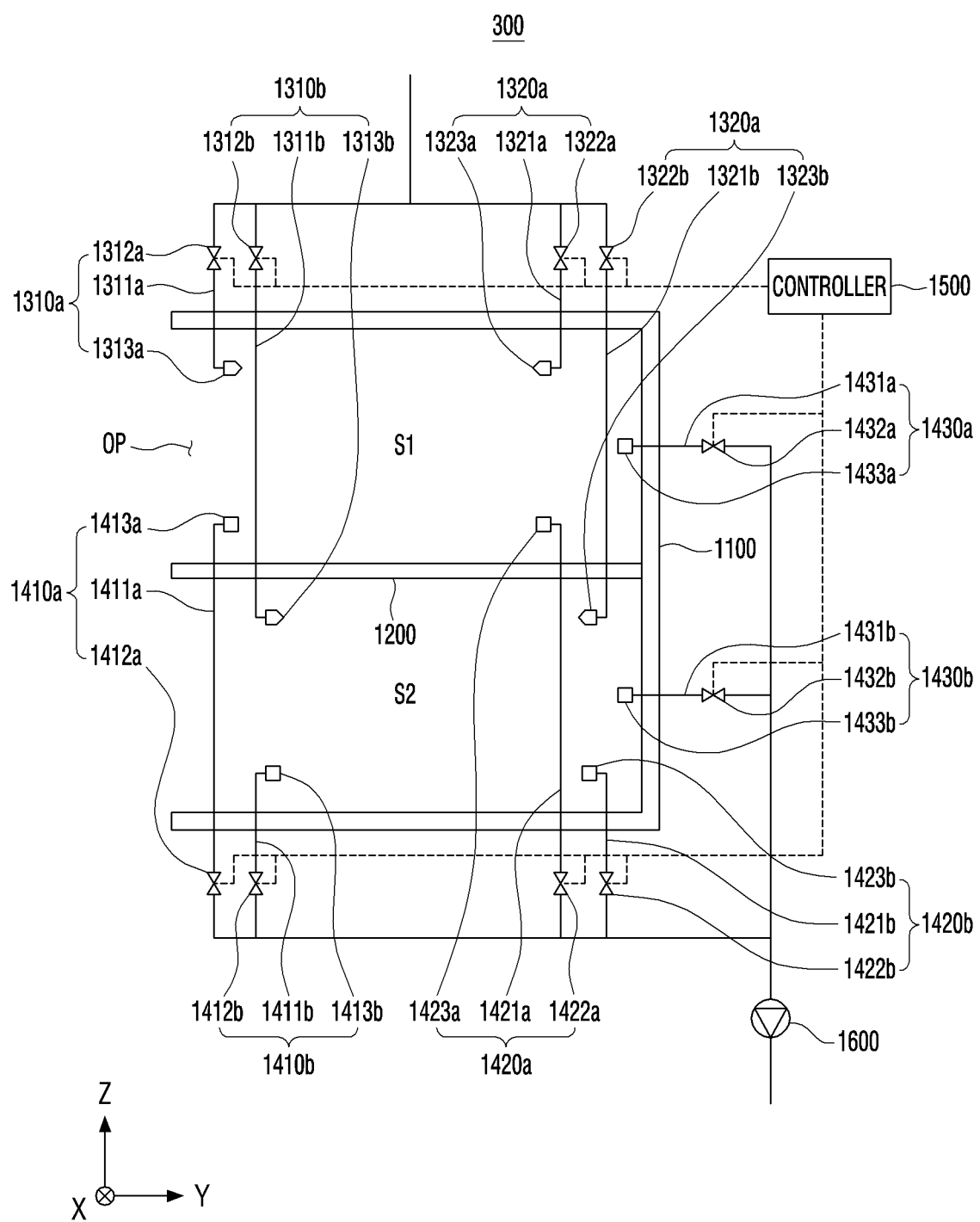
FIG. 2 is a view illustrating a substrate storage apparatus according to an embodiment of the present disclosure.
Figure 3:
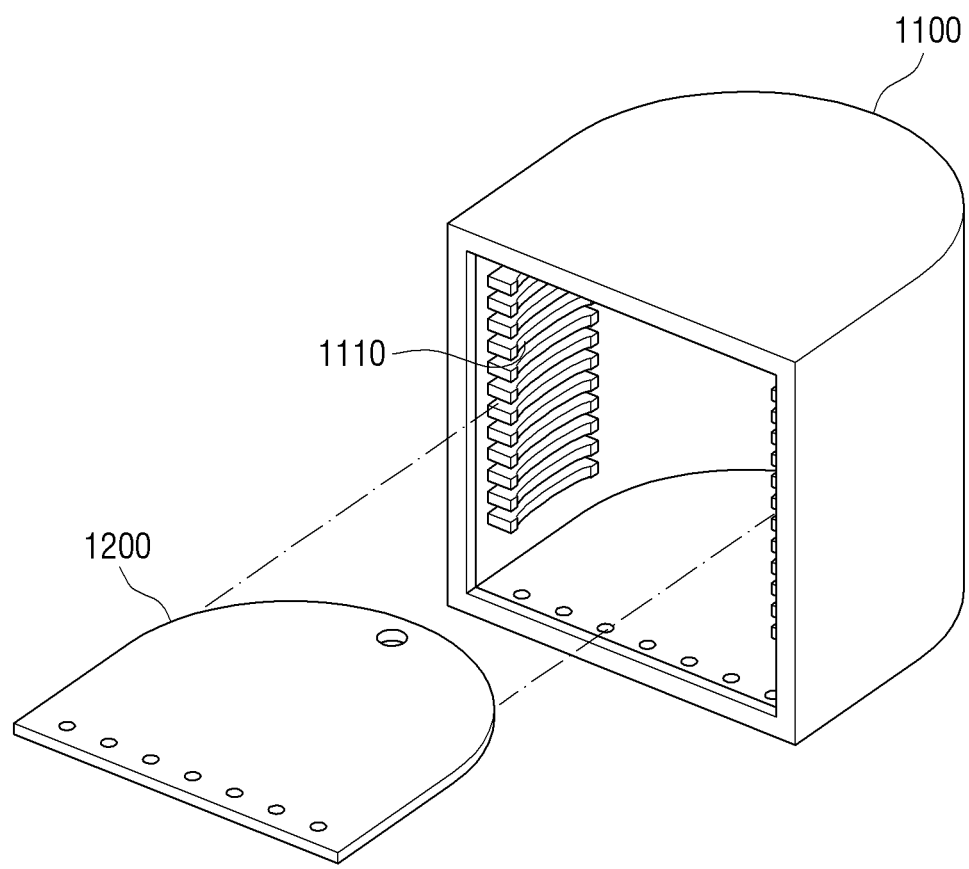
FIGS. 3 and 4 are views illustrating a housing of the substrate storage apparatus according to an embodiment of the present disclosure.
Figure 4:
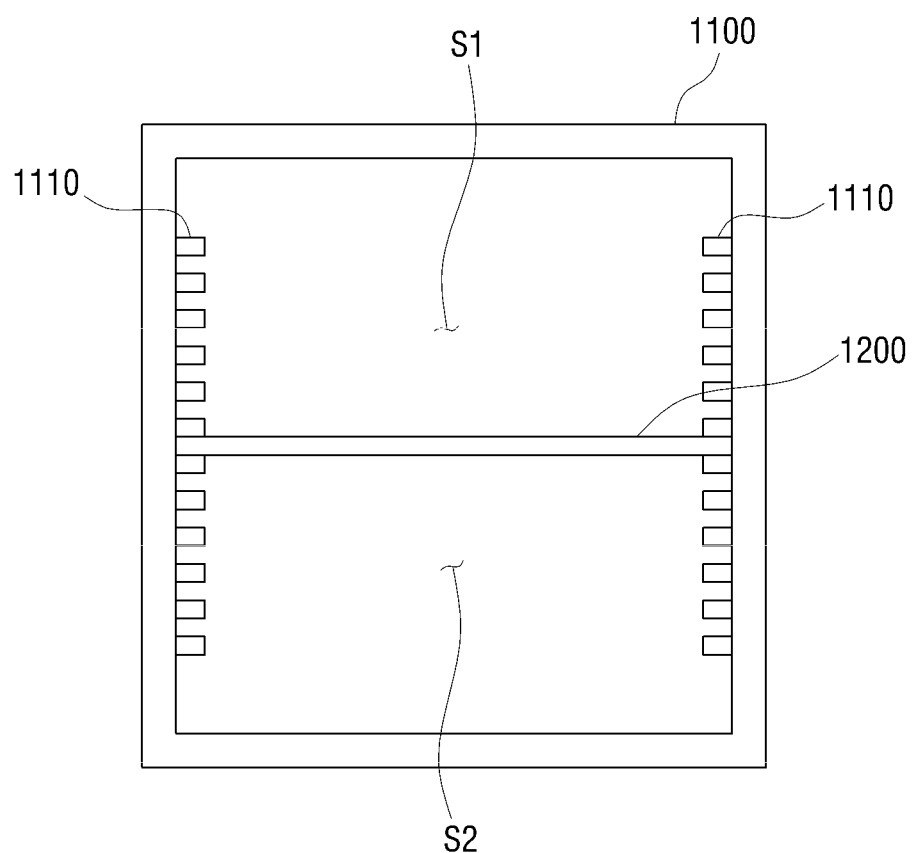

FIG. 2 is a view illustrating the substrate storage apparatus according to an embodiment of the present disclosure, and FIGS. 3 and 4 are views illustrating a housing of the substrate storage apparatus according to an embodiment of the present disclosure.

Referring to FIGS. 2 to 4, the substrate storage apparatus 300 includes a housing 1100, a separation membrane 1200, gas suppliers 1310a, 1310b, 1320a, and 1320b, gas dischargers 1410a, 1410b, 1420a, 1420b, 1430a, and 1430b, and a controller 1500.

The housing 1100 serves to provide loading spaces S1 and S2 for loaded substrates. The housing 1100 may have a long shape in the third direction Z. A plurality of substrates loaded into the loading spaces S1 and S2 may be stacked in the third direction Z.

The housing 1100 may be provided with a loading/unloading port OP having one open side for loading/unloading the substrate. The loading/unloading port OP may be formed in a direction facing the transfer frame 200. The substrate may be transferred between the loading spaces S1 and S2 of the housing 1100 and the transfer frame 200 through the loading/unloading port OP.

A support portion 1110 for supporting the substrate may be provided in the housing 1100. The support portions 1110 may be provided on opposite sides facing each other inside the housing 1100. The support portions 1110 may be provided on a left inner side and a right inner side of the housing 1100 when the inside of the housing 1100 is viewed from the loading/unloading port OP. In addition, the support portion 1110 may be provided on a rear inner side of the housing 1100.

A plurality of support portions 1110 may be disposed in the vertical direction at regular intervals. In addition, a support portion 1110 disposed at a specific height in one inner side may have a support portion 1110 disposed at the same height in another inner side. That is, the substrate loaded into the loading spaces S1 and S2 may be supported by the plurality of supporting portions 1110 having the same height. Further, the intervals between the support portions 1110 disposed in the vertical direction may be the same. Thus, the substrates loaded into the housing 1100 may be stacked at equal intervals.

The separation membrane 1200 is coupled to the housing 1100 to divide the loading spaces S1 and S2 into a plurality of separation spaces S1 and S2 isolated from each other. A wider plane of the separation membrane 1200 may be provided in parallel to a plane including the first direction X and the second direction Y so that the separation membrane 1200 may be coupled to the housing 1100. Since the separation membrane 1200 is coupled to the housing 1100, the loading spaces S1 and S2 may be divided into an upper space S1 and a lower space S2.

The separation membrane 1200 may be coupled to the housing 1100 or decoupled from the housing 1100. A user may couple the separation membrane 1200 to the housing 1100 or decouple the separation membrane 1200 from the housing 1100 in consideration of the working environment. In addition, a size of the upper space S1 and a size of the lower space S2 may vary depending on the coupling position of the separation membrane 1200 coupled to the housing 1100. The user can determine the coupling position of the separation membrane 1200 in consideration of the working environment. Alternatively, the housing 1100 and the separation membrane 1200 may be integrally provided.

An edge of the separation membrane 1200 may tightly adhere to an inner surface of the housing 1100. That is, a gap between the edge of the separation membrane 1200 and the inner surface of the housing 1100 may be removed. Accordingly, gas movement between the upper space S1 and the lower space S2 of the housing 1100 may be prevented.

The gas suppliers 1310a, 1310b, 1320a, and 1320b may supply the purge gas into the loading spaces S1 and S2 for the cleaning operation. The gas dischargers 1410a, 1410b, 1420a, 1420b, 1430a, and 1430b may serve to discharge the purge gas accommodated in the loading spaces S1 and S2. The purge gas supplied to the loading spaces S1 and S2 may dry the substrate or separate the fume from the substrate. The supplied purge gas and the fume separated from the substrate may be discharged from the loading spaces S1 and S2 through the gas dischargers 1410a, 1410b, 1420a, 1420b, 1430a and 1430b.

A plurality of gas suppliers 1310a, 1310b, 1320a, and 1320b and a plurality of gas dischargers 1410a, 1410b, 1420a, 1420b, 1430a, and 1430b may be provided for each of the plurality of separation spaces S1 and S2. That is, a plurality of gas suppliers 1310a, 1310b, 1320a, and 1320b and a plurality of gas dischargers 1410a, 1410b, 1420a, 1420b, 1430a, and 1430b may be provided for one of the separation spaces S1 and S2, and a plurality of gas suppliers 1310a, 1310b, 1320a, and 1320b and a plurality of gas dischargers 1410a, 1410b, 1420a, 1420b, 1430a, and 1430b may be provided for the remaining one of the separation spaces S1 and S2.

Hereinafter, description will be made with respect to the gas suppliers 1310a, 1310b, 1320a, and 1320b including first suppliers 1310a and 1310b and second suppliers 1320a and 1320b, and the gas dischargers 1410a, 1410b, 1420a, 1420b, 1430a, and 1430b including first dischargers 1410a and 1410b, second dischargers 1420a and 1420b, and third dischargers 1430a, 1430b. The first suppliers 1310a and 1310b may be positioned closer to the loading/unloading port OP than the second suppliers 1320a and 1320b, and the first dischargers 1410a and 1410b may be positioned closer to the loading/unloading port OP than the second dischargers 1420a and 1420b.

The first suppliers 1310a and 1310b and the second suppliers 1320a and 1320b may supply the purge gas to the loading spaces S1 and S2. In the present disclosure, the purge gas may be an inert gas or air. The loading spaces S1 and S2 may have a positive pressure due to the purge gas supplied from the first suppliers 1310a and 1310b and the second suppliers 1320a and 1320b so that the fume attached to the substrate may be separated from the substrate. Further, since the loading spaces S1 and S2 have the positive pressure, foreign substances may be prevented from flowing into the loading spaces S1 and S2 through the loading/unloading port OP.

The first dischargers 1410a and 1410b and the second dischargers 1420a and 1420b may serve to discharge the gas accommodated in the loading spaces S1 and S2 to the outside. The purge gas and fume accommodated in the loading spaces S1 and S2 may be discharged to the outside through the first dischargers 1410a and 1410b and the second dischargers 1420a and 1420b.

Each of the first suppliers 1310a and 1310b and the second suppliers 1320a and 1320b may include gas supply lines 1311a, 1311b, 1321a and 1321b, gas supply valves 1312a, 1312b, 1322a, and 1322b and spray nozzles 1313a, 1313b, 1323a, and 1323b.

The gas supply lines 1311a, 1311b, 1321a and 1321b may provide a transfer path for the purge gas supplied to the loading spaces S1 and S2. The gas supply valves 1312a, 1312b, 1322a, and 1322b may control the amount of the purge gas transferred along the gas supply lines 1311a, 1311b, 1321a, and 1321b. The gas supply valves 1312a, 1312b, 1322a, and 1322b may be controlled by the controller 1500.

The spray nozzles 1313a, 1313b, 1323a and 1323b may serve to spray the purge gas transferred through the gas supply lines 1311a, 1311b, 1321a and 1321b into the loading spaces S1 and S2.

The first suppliers 1310a and 1310b and the second suppliers 1320a and 1320b may be provided for each of the separation spaces S1 and S2. In the following description, the first supplier 1310a and the second supplier 1320a provided corresponding to the upper space S1 will be referred to as an upper first supplier 1310a and an upper second supplier 1320a, and the first supply part 1310b and the second supply part 1320b provided corresponding to the lower space S2 will be referred to as a lower first supply part 1310b and a lower second supply part 1320b.

Each of the first dischargers 1410a and 1410b and the second dischargers 1420a and 1420b may include gas discharge lines 1411a, 1411b, 1421a and 1421b, gas discharge valves 1412a, 1412b, 1422a and 1422b, and discharge ports 1413a, 1413b, 1423a, and 1423b.

The gas discharge lines 1411a, 1411b, 1421a, and 1421b may provide a transfer path for the purge gas discharged from the loading spaces S1 and S2. The gas discharge valves 1412a, 1412b, 1422a, and 1422b may serve to regulate the amount of the purge gas transferred along the gas discharge lines 1411a, 1411b, 1421a, and 1421b. The gas discharge valves 1412a, 1412b, 1422a, and 1422b may be controlled by the controller 1500.

The discharge ports 1413a, 1413b, 1423a and 1423b may collect the purge gas accommodated in the loading spaces S1 and S2 to guide the collected purge gas to the gas discharge lines 1411a, 1411b, 1421a and 1421b.

A booster pump 1600 may be connected to the gas discharge lines 1411a, 1411b, 1421a, and 1421b. The booster pump 1600 may pressurize a gas transferred through the gas discharge lines 1411a, 1411b, 1421a, and 1421b. The purge gas and the fume may be more easily transferred by the booster pump 1600.

The first dischargers 1410a and 1410b and the second dischargers 1420a and 1420b may be provided for each of the separation spaces S1 and S2. In the following description, the first discharger 1410a and the second discharger 1420a provided corresponding to the upper space S1 will be referred to as an upper first discharger 1410a and an upper second discharger 1420a, and the first dischargers 1410b and the second dischargers 1420b provided corresponding to the lower space S2 will be referred to as a lower first discharger 1410b and a lower second discharger 1420b.

The gas dischargers 1410a, 1410b, 1420a, 1420b, 1430a, and 1430b may include third dischargers 1430a and 1430b. Similar to the first dischargers 1410a and 1410b and the second dischargers 1420a and 1420b, the third dischargers 1430a and 1430b may include gas discharge lines 1431a and 1431b, gas discharge valves 1432a and 1432b, and discharge ports 1433a and 1433b.

The third dischargers 1430a and 1430b may serve to discharge a gas in a lateral direction. The discharge ports 1433a and 1433b of the third dischargers 1430a and 1430b may be provided on a rear surface of the housing 1100. As the supplied purge gas is discharged through the third dischargers 1430a and 1430b, the purge gas moves in the lateral direction so that the fume may be removed.

The operation of the third dischargers 1430a and 1430b may be selectively performed. For example, only the first dischargers 1410a and 1410b and the second dischargers 1420a and 1420b may operate, the third dischargers 1430a and 1430b may operate together with the first dischargers 1410a and 1410b and the second dischargers 1420a and 1420b, or only the third dischargers 1430a and 1430b may operate in a state in which the first dischargers 1410a and 1410b and the second dischargers 1420a and 1420b are not operated. The operation of the third dischargers 1430a and 1430b may be determined according to the state of the substrate loaded in the separation spaces S1 and S2.

The controller 1500 may serve to control the supply and discharge of the purge gas with respect to each of the plurality of separation spaces S1 and S2. In particular, the controller 1500 may individually control the plurality of gas suppliers 1310a, 1310b, 1320a, and 1320b and the plurality of gas dischargers 1410a, 1410b, 1420a, 1420b, 1430a, and 1430b provided for each of the plurality of separation spaces S1 and S2.

Each of the plurality of separation spaces S1 and S2 may accommodate the substrates which have been subjected to the same process or have the same state. For example, the substrates unloaded from the carrier 110 may have the same state because the substrates are not processed by the process unit 700. Further, the substrates processed in a specific process unit 700 may have the same state. Thus, one of the separation spaces S1 and S2 may accommodate only the substrates which are not processed and the remaining one of the separation spaces S1 and S2 may accommodate only the substrates which have been processed in the specific process unit 700.

The cleaning operation for the substrates having mutually different states may vary depending on the state of each substrate. That is, the cleaning operation may vary for the substrate on which the process is not performed, the substrate on which the first process has been performed, and the substrate on which the second process has been performed.

As the plurality of gas suppliers 1310a, 1310b, 1320a and 1320b and the plurality of gas dischargers 1410a, 1410b, 1420a, 1420b, 1430a and 1430b provided for each of the plurality of separation spaces S1 and S2 are individually controlled by the controller 1500, the cleaning operation according to the state of the substrate may be performed.

Specifically, the controller 1500 may control the plurality of gas suppliers 1310a, 1310b, 1320a, and 1320b and the plurality of gas dischargers 1410a, 1410b, 1420a, 1420b, 1430a, and 1430b through one of a filling mode and an exhaust mode such that a gas flow can be formed for the plurality of separation spaces S1 and S2. In the present disclosure, the filling mode represents a mode in which each of the plurality of separation spaces S1 and S2 is kept filled with the purge gas, and the exhaust mode represents a mode in which each of the plurality of separation spaces S1 and S2 is exhausted in a state in which the filling of the purge gas is not maintained.

The controller 1500 may implement the filling mode or the exhaust mode by controlling the number of operations of the plurality of gas suppliers 1310a, 1310b, 1320a, and 1320b and the plurality of gas dischargers 1410a, 1410b, 1420a, 1420b, 1430a and 1430b provided in each of the plurality of separation spaces S1 and S2. For example, the controller 1500 may implement the filling mode by setting the number of operations of the gas suppliers 1310a, 1310b, 1320a, and 1320b to be greater than the number of operations of the gas dischargers 1410a, 1410b, 1420a, 1420b, 1430a, and 1430b and may implement the exhaust mode by setting the number of operations of the gas suppliers 1310a, 1310b, 1320a, and 1320b to be smaller than the number of operations of the gas dischargers 1410a, 1410b, 1420a, 1420b, 1430a, and 1430b.

For example, the controller 1500 may allow the purge gas to be supplied through the first suppliers 1310a and 1310b and the second suppliers 1320a and 1320b in the filling mode, and the controller 1500 may allow the purge gas to be supplied through the first suppliers 1310a and 1310b in a state in which the supply of the purge gas through the second suppliers 1320a and 1320b is blocked in the exhaust mode. In addition, the controller 1500 may allow the purge gas to be discharged through the first dischargers 1410a and 1410b and the second dischargers 1420a and 1420b in the exhaust mode, and the controller 1500 may allow the purge gas to be discharged through the first dischargers 1410a and 1410b in a state in which the discharge of the purge gas through the second dischargers 1420a and 1420b is blocked in the filling mode. In addition, the controller 1500 may allow the purge gas to be selectively discharged through the third dischargers 1430a and 1430b in the exhaust mode.

The controller 1500 may select the working mode according to the state of the substrate in each of the separation spaces S1 and S2 and the cleaning operation may be performed in each of the separation spaces S1 and S2 since a gas flow corresponding to the filling mode or the exhaust mode may be formed in each of the separation spaces S1 and S2.

The working mode may be determined according to the type of gas used for processing the substrate before the substrate is loaded into the loading spaces S1 and S2. For example, the cleaning operation may be performed in the exhaust mode with respect to the substrate that has been processed with a gas containing fluorine (F), chlorine (Cl), or bromine (Br). Meanwhile, the cleaning operation can be performed in the filling mode with respect to the substrate that has been processed with a gas containing ammonia ($NH_3$).

Alternatively, the working mode may be determined according to the purpose of cleaning. For example, when it is necessary to remove the fume from the substrate, the cleaning operation may be performed in the exhaust mode, and when it is necessary to dry the substrate, the cleaning operation may be performed in the filling mode. When the substrate storage apparatus 300 operates in the filling mode, water vapor in the loading spaces S1 and S2 may be removed so that the reaction between the ion components and the water vapor existing in the substrate may be suppressed.

The housing 1100 may have a heater (not shown) for heating the loading spaces S1 and S2. The heater may heat the loading spaces S1 and S2 while the cleaning operation is performed. The heater may heat the loading spaces S1 and S2 at a higher temperature in the filling mode than in the exhaust mode. Since the heating is performed at the higher temperature, the steam removal efficiency in the loading spaces S1 and S2 may be improved.

Hereinafter, the detailed structure of the substrate storage apparatus 300 will be described with reference to FIGS. 5 to 9.

Figure 5:
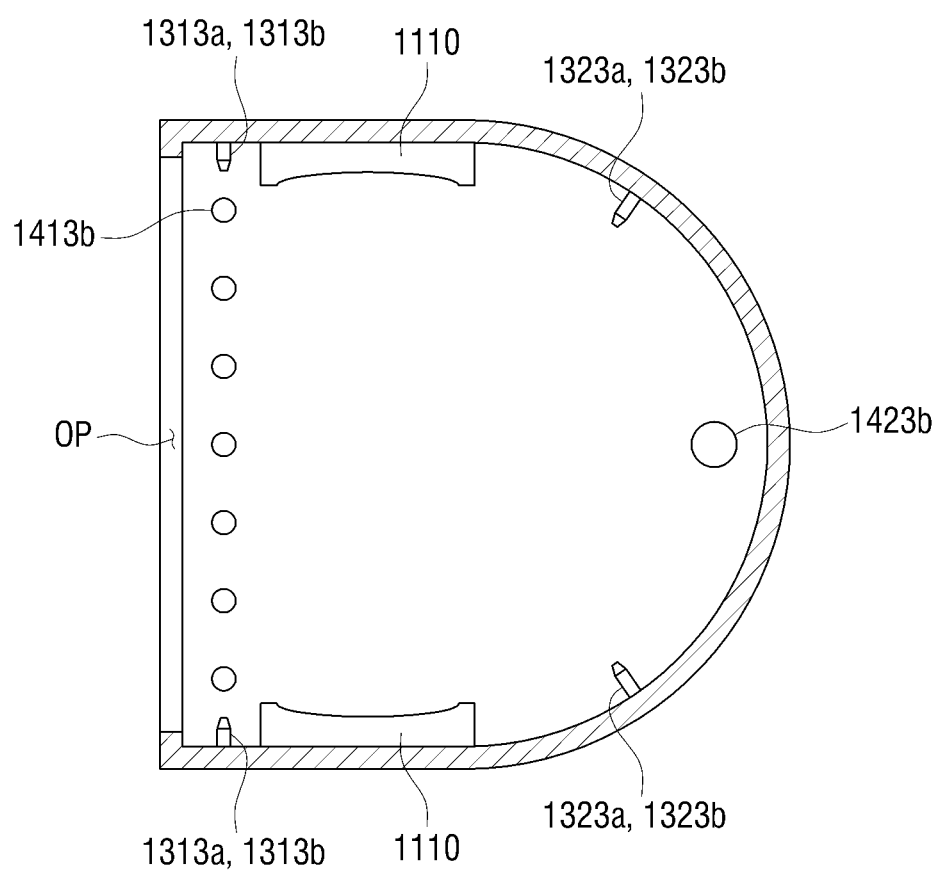
FIG. 5 is a plan view of the substrate storage apparatus according to an embodiment of the present disclosure.
Figure 6:
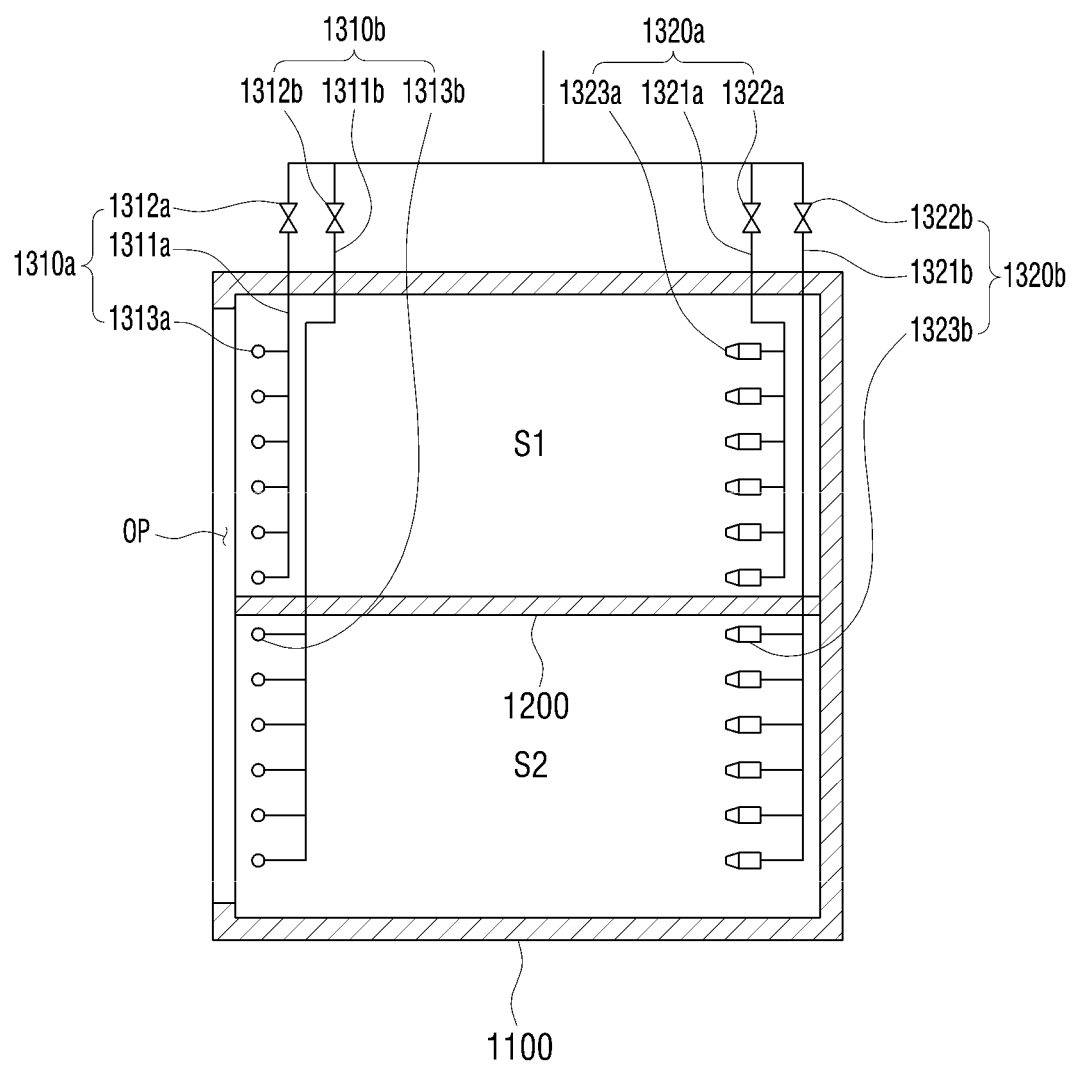
FIG. 6 is a view illustrating a gas supplier installed in the housing of the substrate storage apparatus according to an embodiment of the present disclosure.
Figure 7:
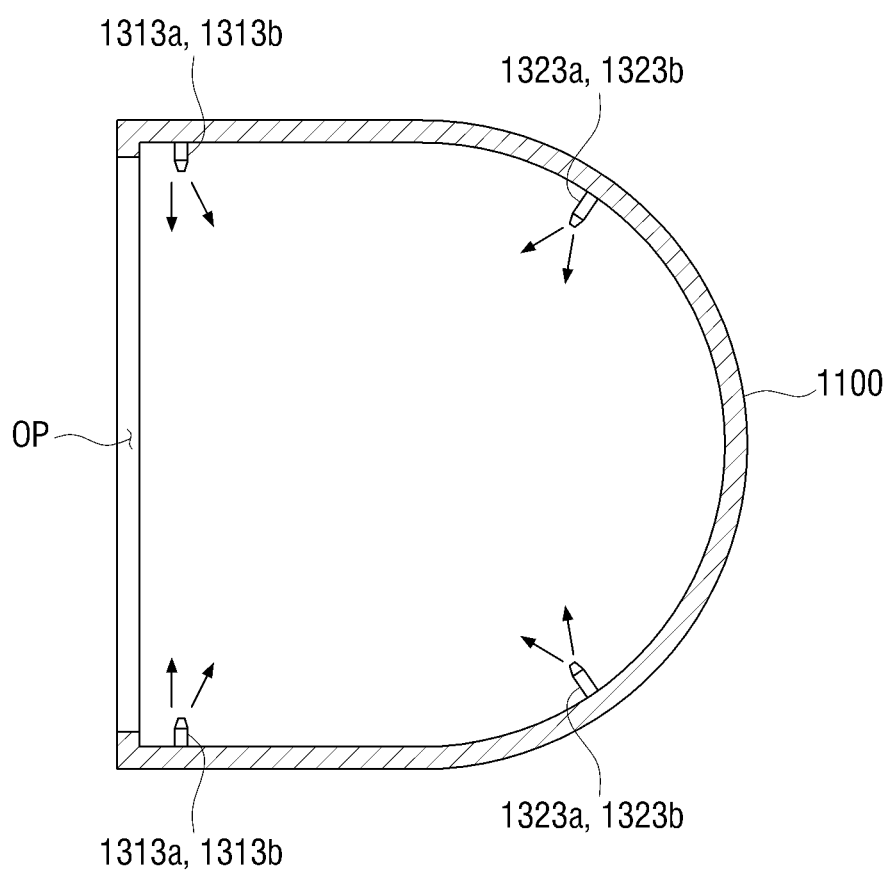
FIG. 7 is a view illustrating a purge gas being sprayed by the gas supplier according to an embodiment of the present disclosure.
Figure 8:
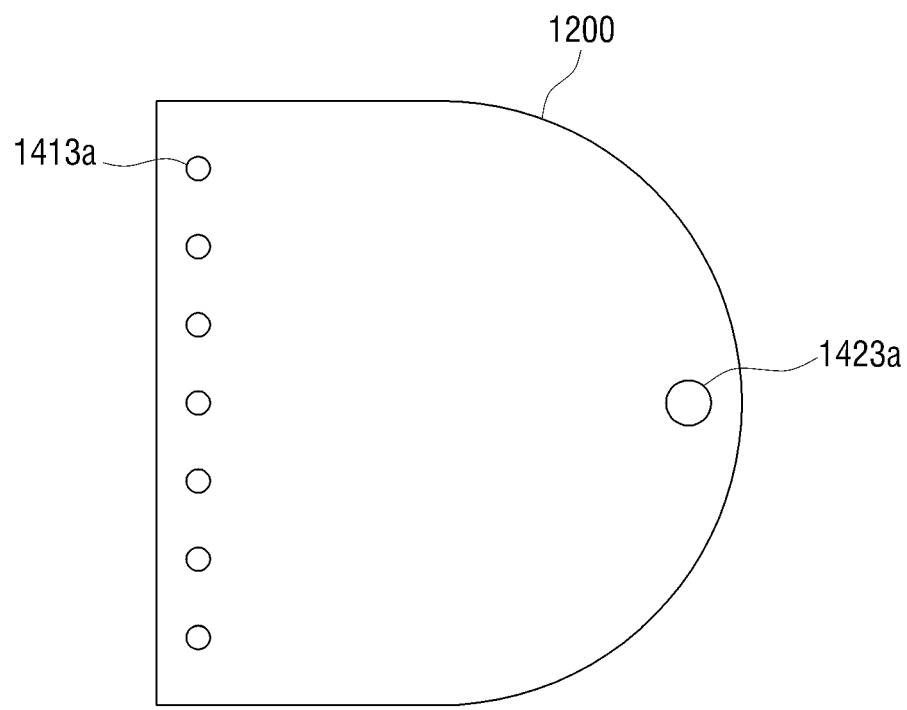
FIG. 8 is a plan view of a separation membrane according to an embodiment of the present disclosure.
Figure 9:
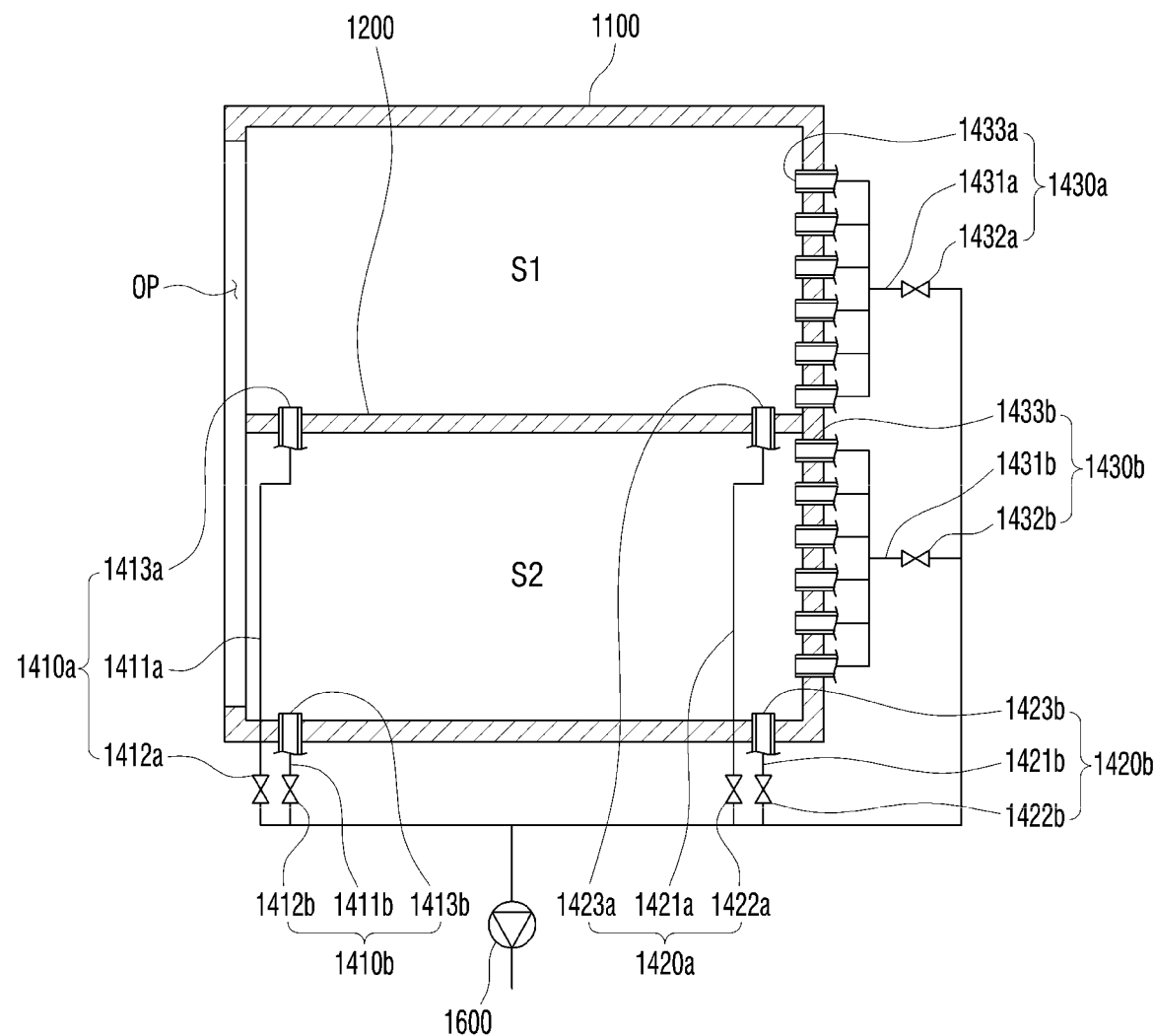
FIG. 9 is a view illustrating a gas discharger installed in the housing of the substrate storage apparatus according to an embodiment of the present disclosure.

FIG. 5 is a plan view of the substrate storage apparatus according to an embodiment of the present disclosure, FIG. 6 is a view illustrating the gas supplier installed in the housing of the substrate storage apparatus according to an embodiment of the present disclosure, FIG. 7 is a view illustrating a purge gas being sprayed by the gas supplier according to an embodiment of the present disclosure, FIG. 8 is a plan view of the separation membrane according to an embodiment of the present disclosure, and FIG. 9 is a view illustrating the gas discharger installed in the housing of the substrate storage apparatus according to an embodiment of the present invention.

Referring to FIGS. 5 to 7, the spray nozzles 1313a, 1313b, 1323a, and 1323b of the gas suppliers 1310a, 1310b, 1320a, and 1320b may be disposed to spray the purge gas toward the inside of the loading spaces S1 and S2.

The gas supply lines 1311a, 1311b, 1321a and 1321b may be vertically disposed in the loading spaces S1 and S2 and the plurality of spray nozzles 1313a, 1313b, 1323a and 1323b may be disposed along the gas supply lines 1311a, 1311b, 1321a, and 1321b. The gas supply lines 1311a and 1311b and the spray nozzles 1313a and 1313b of the first suppliers 1310a and 1310b may be disposed adjacent to the loading/unloading port OP and the gas supply lines 1321a and 1321b and the spray nozzles 1323a and 1323b of the second suppliers 1320a and 1320b may be disposed adjacent to a rear surface of the housing 1100. The gas supply lines 1311a, 1311b, 1321a and 1321b may be disposed along the surface of the housing 1100 so as not to interfere with the substrates loaded in the loading spaces S1 and S2 of the housing 1100.

The gas supply lines 1311a and 1321a and the spray nozzles 1313a and 1323a of the upper first supplier 1310a and the upper second supplier 1320a may extend to the upper space S1 and the gas supply lines 1311b and 1321b and the spray nozzles 1313b and 1323b of the lower first supplier 1310b and the lower second supplier 1320b may extend to the lower space S2. Accordingly, the upper first supplier 1310a and the upper second supplier 1320a may supply the purge gas only to the upper space S1, and the lower first supplier 1310b and the lower second supplier 1320b may supply the purge gas only to the lower space S2.

The spray nozzles 1313a and 1313b of the first suppliers 1310a and 1310b may be disposed on both sides of the loading/unloading port OP when viewed from the front of the loading/unloading port OP. Hereinafter, the gas supply lines 1311a and 1311b and the spray nozzles 1313a and 1313b of the first suppliers 1310a and 1310b will be referred to as first gas supply lines 1311a and 1311b and first spray nozzles 1313a and 1313b, respectively. As shown in FIG. 7, the first spray nozzles 1313a and 1313b disposed on both sides may spray the purge gas in a direction facing each other. In this case, the first spray nozzles 1313a and 1313b may spray the purge gas in a direction parallel to the first direction X. Further, the first spray nozzles 1313a and 1313b may spray the purge gas in a direction parallel to an open surface of the loading/unloading port OP or may spray the purge gas in a direction that forms an acute angle with respect to the open surface of the loading/unloading port OP.

As described above, the plurality of first spray nozzles 1313a and 1313b may be disposed to be spaced apart from each other at regular intervals along the long axis of the first gas supply lines 1311a and 1311b. The interval between the adjacent first spray nozzles 1313a and 1313b may be the same as the interval between the adjacent support portions 1110 provided in the housing 1100. Further, each of the first spray nozzles 1313a and 1313b may spray the purge gas onto the substrate supported by the support portion 1110 disposed at the corresponding height. Thus, the two first spray nozzles 1313a and 1313b disposed at the same height may spray the purge gas onto one substrate.

The spray nozzles 1323a and 1323b of the second suppliers 1320a and 1320b may be disposed on both sides of the rear surface of the housing 1100. Hereinafter, the gas supply lines 1321a and 1321b and the spray nozzles 1323a and 1323b of the second suppliers 1320a and 1320b will be referred to as second gas supply lines 1321a and 1321b and second spray nozzles 1323a and 1323b, respectively. As shown in FIG. 7, the second spray nozzles 1323a and 1323b disposed on both sides may spray the purge gas toward the inside of the housing 1100. In this case, the second spray nozzles 1323a and 1323b may spray the purge gas in a direction parallel to the first direction X.

As described above, the plurality of second spray nozzles 1323a and 1323b may be disposed to be spaced apart from each other at regular intervals along the long axis of the second gas supply lines 1321a and 1321b. The interval between the adjacent second spray nozzles 1323a and 1323b may be the same as the interval between the adjacent support portions 1110 provided in the housing 1100. Further, each of the second spray nozzles 1323a and 1323b may spray the purge gas onto the substrate supported by the support portion 1110 disposed at the corresponding height. Thus, the two second spray nozzles 1323a and 1323b disposed at the same height may spray the purge gas onto one substrate.

Referring to FIGS. 5, 8 and 9, the discharge ports 1413a, 1413b, 1423a, 1423b, 1433a and 1433b of the gas dischargers 1410a, 1410b, 1420a, 1420b, 1430a and 1430b may be disposed to discharge the purge gas in the loading spaces S1 and S2.

The discharge ports 1413a, 1413b, 1423a, and 1423b of the first dischargers 1410a and 1410b and the second dischargers 1420a and 1420b may be disposed on the upper surface or the lower surface of the separation spaces S1 and S2. For this purpose, the discharge ports 1413a, 1413b, 1423a, and 1423b of the first dischargers 1410a and 1410b and the second dischargers 1420a and 1420b may be disposed on a ceiling surface or a bottom surface of the housing 1100 or may be disposed on the upper surface or the lower surface of the separation membrane 1200. The discharge port disposed on the ceiling surface of the housing 1100 may discharge the purge gas in the upper space S1, and the discharge port disposed on the bottom surface of the housing 1100 may discharge the purge gas in the lower space S2. Further, the discharge ports 1413a and 1423a disposed on the upper surface of the separation membrane 1200 may discharge the purge gas in the upper space S1, and the discharge ports 1413b and 1423b disposed on the lower surface of the separation membrane 1200 may discharge the purge gas in the lower space S2. The fume separated from the substrate may be discharged through the discharge ports 1413a, 1413b, 1423a, and 1423b together with the purge gas. Hereinafter, the description will be made with respect to the discharge ports 1413a, 1413b, 1423a, and 1423b provided on the bottom surface of the housing 1100 and the upper surface of the separation membrane 1200.

The gas discharge lines 1411a and 1411b and the discharge ports 1413a and 1413b of the first dischargers 1410a and 1410b may be disposed adjacent to the loading/unloading port OP, and the gas discharge lines 1421a and 1421b and the discharge ports 1423a and 1423b of the second dischargers 1420a and 1420b may be disposed adjacent to the rear surface of the housing 1100.

The gas discharge lines 1411a and 1421a of the upper first discharger 1410a and the upper second discharger 1420a may extend to the upper space S1 and the discharge ports 1413a and 1423a may be disposed on the upper surface of the separation membrane 1200. The gas discharge lines 1411b and 1421b of the lower first discharger 1410b and the lower second discharger 1420b may extend to the lower space S2 and the discharge ports 1413b and 1423b may be disposed on the bottom surface of the housing 1100. Therefore, the upper first discharger 1410a and the upper second discharger 1420a may discharge only the purge gas in the upper space S1 and the lower first discharger 1410b, and the lower second discharger 1420b may discharge only the purge gas in the lower space S2.

In the following description, the gas discharge lines 1411a and 1411b and the discharge ports 1413a and 1413b of the first dischargers 1410a and 1410b will be referred to as first gas discharge lines 1411a and 1411b and first discharge ports 1413a and 1413b, respectively. A plurality of first discharge ports 1413a and 1413b may be provided. As shown in FIGS. 5 and 8, the plurality of first discharge ports 1413a and 1413b may be disposed parallel to the open surface of the loading/unloading port OP. That is, the first discharge ports 1413a and 1413b may be disposed in parallel along the edge of the loading/unloading port OP. Since the foreign substances introduced from the outside through the loading/unloading port OP are primarily discharged through the first discharge ports 1413a and 1413b, adhesion of the foreign substances to the substrate may be prevented in advance.

Referring to FIG. 9, the discharge ports 1433a and 1433b of the third dischargers 1430a and 1430b may be disposed on the rear surfaces of the separation spaces S1 and S2. The third dischargers 1430a and 1430b may include an upper third discharger 1430a and a lower third discharger 1430b.

The gas discharge line 1431a of the upper third discharger 1430a may extend to the upper space S1 and the discharge port 1433a may be disposed on the rear surface of the housing 1100. The gas discharge line 1431a of the lower third discharger 1430b may extend to the lower space S2 and the discharge port 1433b may be disposed on the rear surface of the housing 1100. Therefore, the upper third discharger 1430a may discharge only the purge gas in the upper space S1, and the lower third discharger 1430b may discharge only the purge gas in the lower space S2.

FIGS. 10 to 13 are views illustrating movement of the purge gas of the substrate storage apparatus according to an embodiment of the present disclosure.

Figure 10:
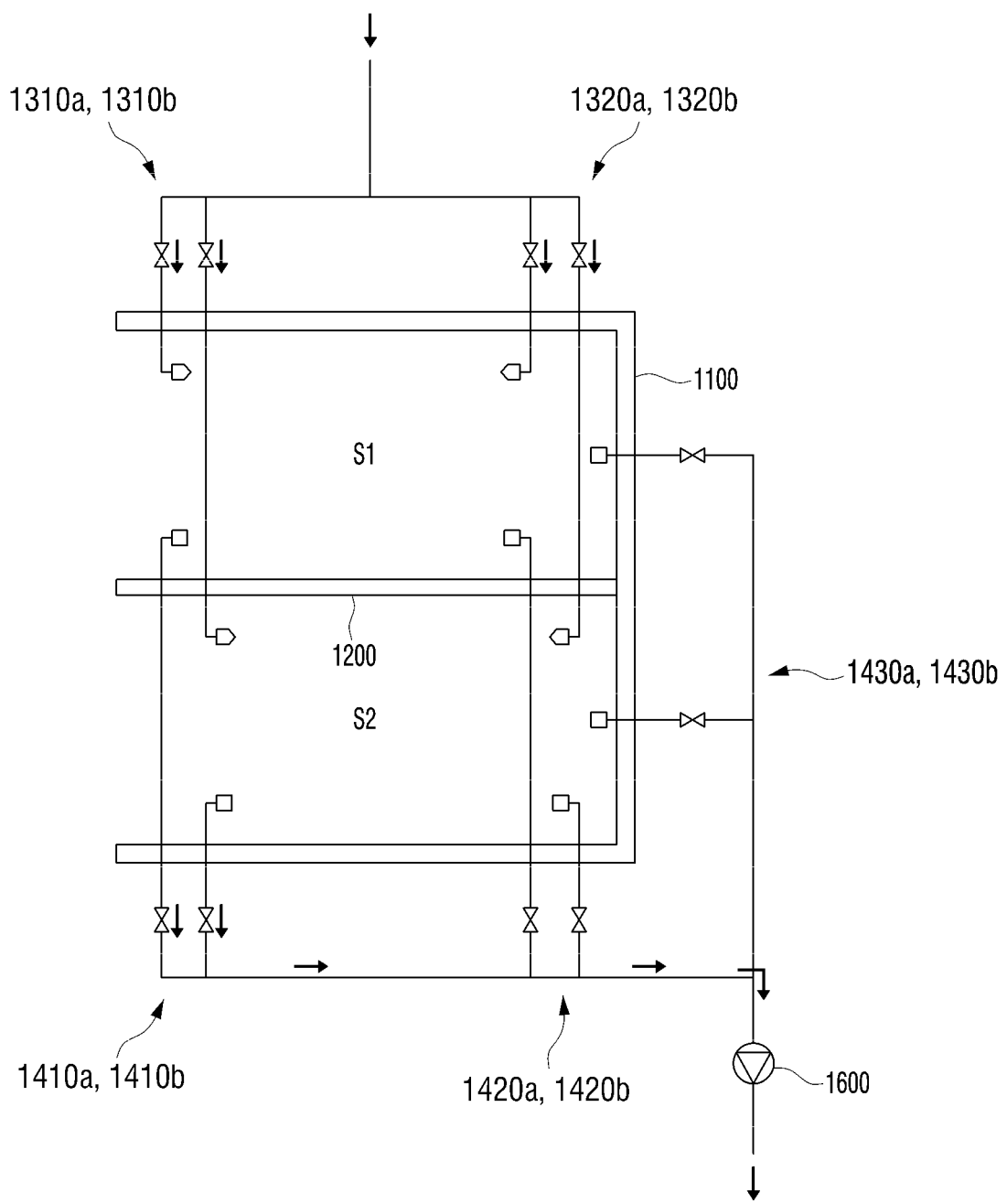
FIGS. 10 to 13 are views illustrating the movement of a purge gas in the substrate storage apparatus according to an embodiment of the present disclosure.

Referring to FIG. 10, the substrate storage apparatus 300 may operate in the filling mode to perform the cleaning operation on the substrate.

In order to operate in the filling mode, the first suppliers 1310a and 1310b and the second suppliers 1320a and 1320b may supply the purge gas, and the first dischargers 1410a and 1410b may discharge the purge gas in a state in which the discharge of the purge gas through the second dischargers 1420a and 1420b is blocked. Since the amount of the purge gas flowing into the loading spaces S1 and S2 is greater than the amount of the purge gas discharged from the loading spaces S1 and S2, the substrate storage apparatus 300 may perform the cleaning operation in a state in which the loading spaces S1 and S2 are filled with the purge gas. For example, the substrate storage apparatus 300 may perform a drying operation on the substrate.

Figure 11:
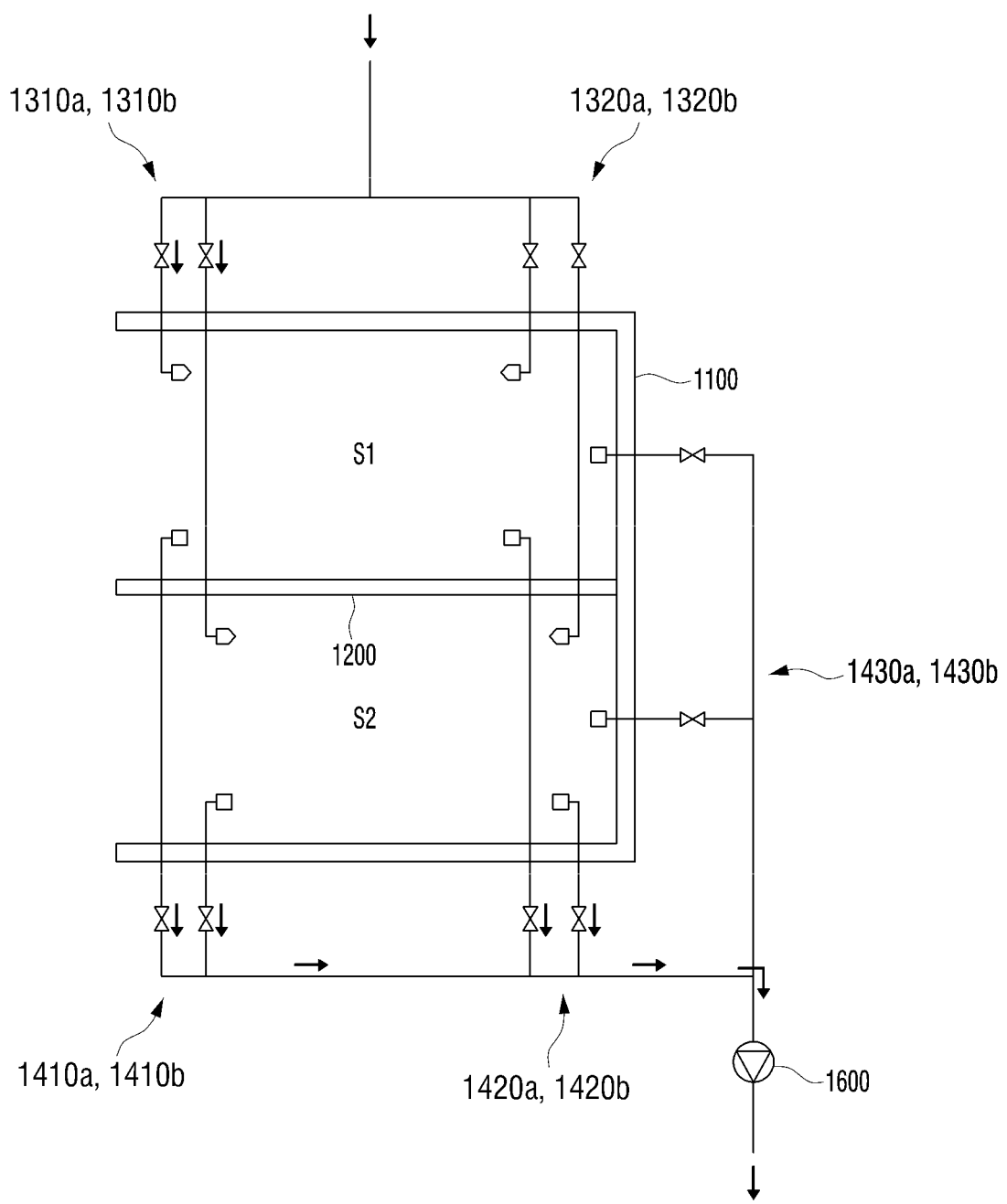

Referring to FIG. 11, the substrate storage apparatus 300 may operate in the exhaust mode to perform the cleaning operation on the substrate.

In order to operate in the exhaust mode, the first suppliers 1310a and 1310b may supply the purge gas in a state in which the supply of the purge gas through the second suppliers 1320a and 1320b is blocked, and the first dischargers 1410a and 1410b and the second dischargers 1420a and 1420b may discharge the purge gas. Since the amount of the purge gas flowing into the loading spaces S1 and S2 is smaller than the amount of the purge gas discharged from the loading spaces S1 and S2, the substrate storage apparatus 300 may quickly discharge the introduced purge gas to perform the cleaning operation. For example, the substrate storage apparatus 300 can perform the operation of separating the fume from the substrate.

Figure 12:
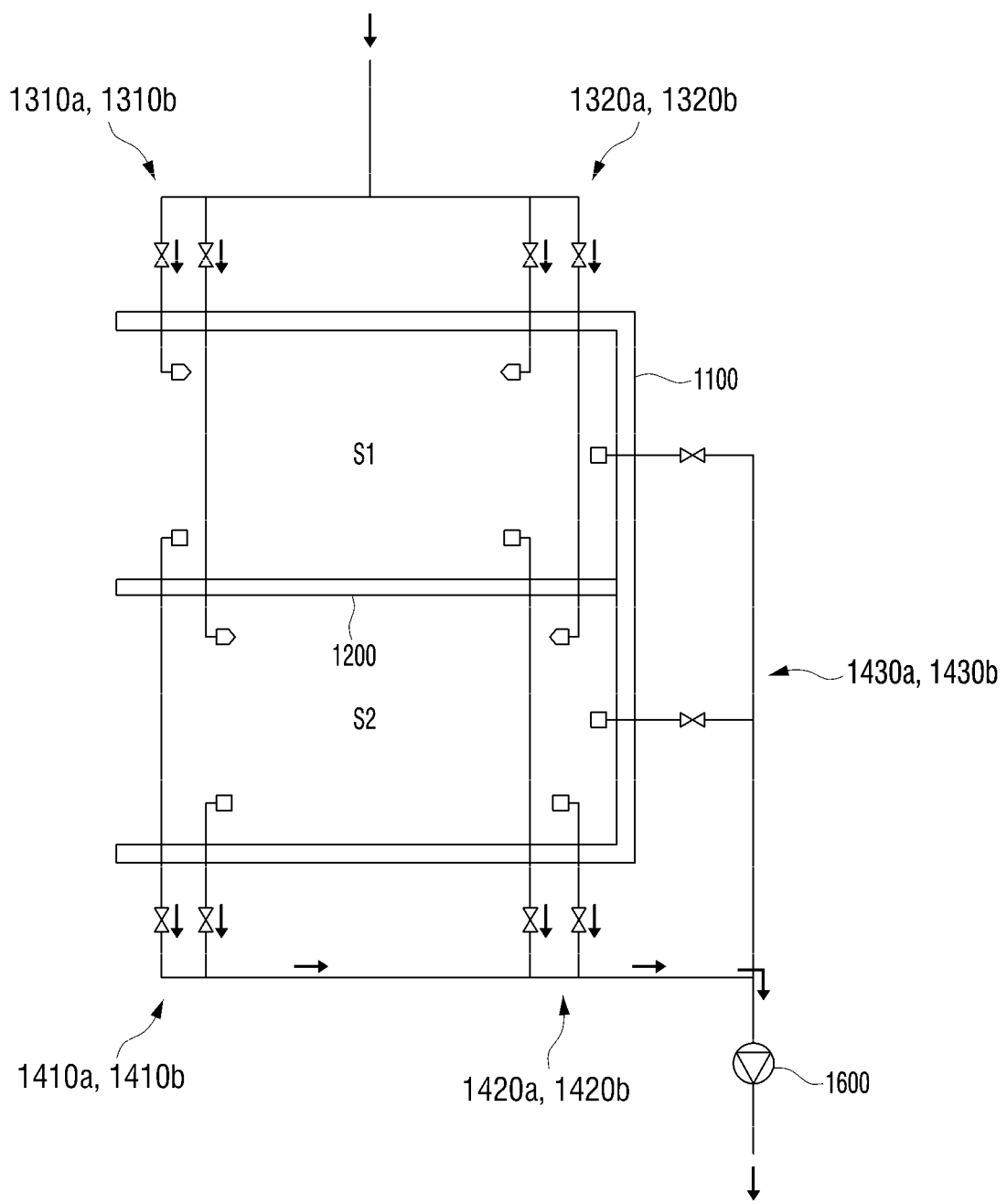

Referring to FIG. 12, the substrate storage apparatus 300 may operate in an intermediate mode between the filling mode and the exhaust mode to perform the cleaning operation on the substrate.

In order to operate in the intermediate mode, the first suppliers 1310a and 1310b and the second suppliers 1320a and 1320b may supply the purge gas, and the first dischargers 1410a and 1410b and the second dischargers 1420a and 1420b may discharge the purge gas. Since the amount of the purge gas flowing into the loading spaces S1 and S2 is equal or similar to the amount of the purge gas discharged from the loading spaces S1 and S2, the substrate storage apparatus 300 may perform the cleaning operation in a state in which the loading spaces S1 and S2 are filled with a predetermined amount of the purge gas.

Figure 13:
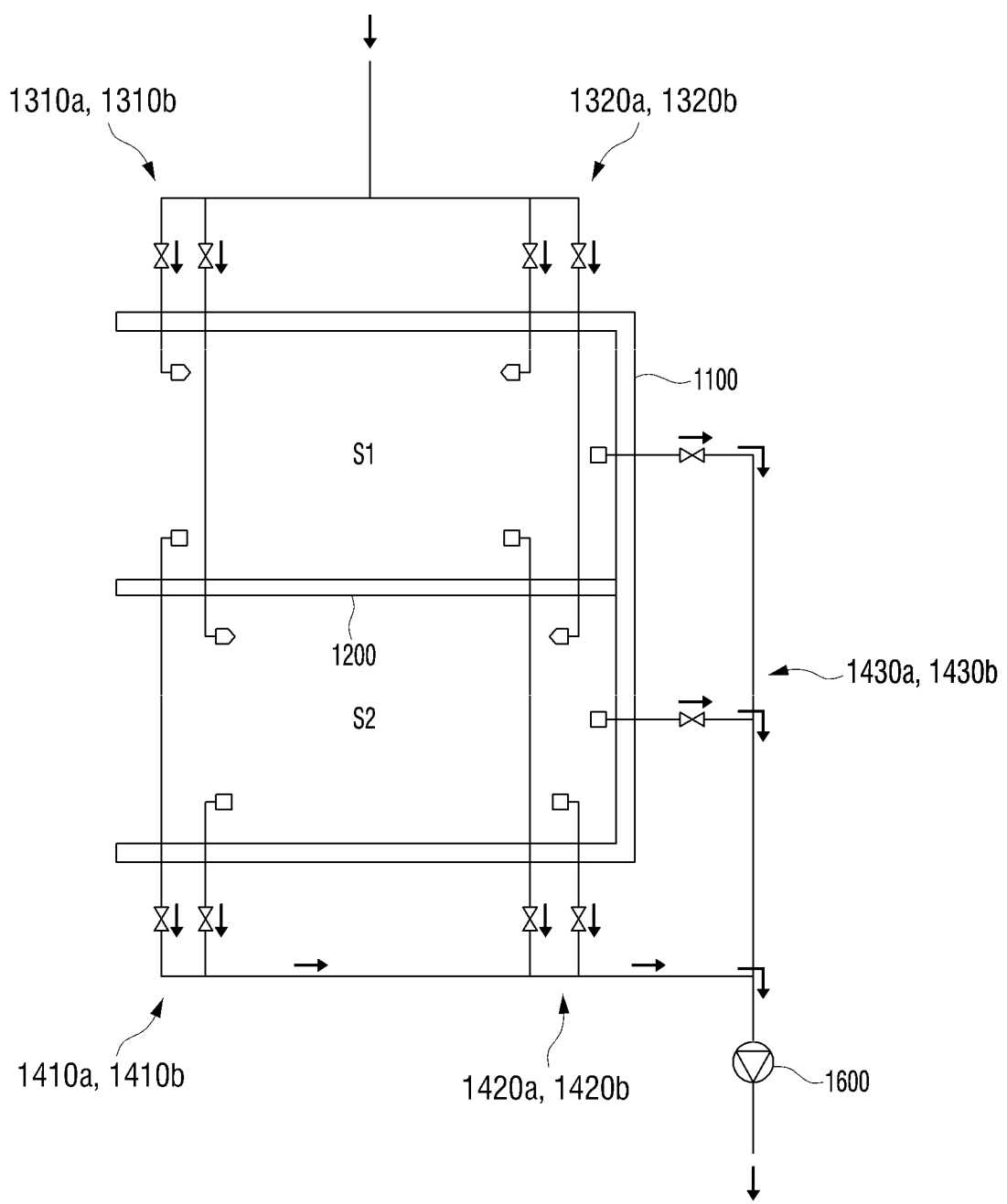

Referring to FIG. 13, the substrate storage apparatus 300 may operate in the exhaust mode using the third dischargers 1430a and 1430b to perform the cleaning operation on the substrate.

In order to operate in the exhaust mode, the first suppliers 1310a and 1310b and the second suppliers 1320a and 1320b may supply the purge gas, and the first dischargers 1410a and 1410b, the second dischargers 1420a and 1420b, and the third dischargers 1430a and 1430b may discharge the purge gas. Since the amount of the purge gas flowing into the loading spaces S1 and S2 is smaller than the amount of the purge gas discharged from the loading spaces S1 and S2, the substrate storage apparatus 300 may quickly discharge the introduced purge gas to perform the cleaning operation.

Meanwhile, FIGS. 10 to 13 show that the operation modes for the upper space S1 and the lower space S2 are the same, but the operation mode for each of the separation spaces S1 and S2 may vary depending on the state of the loaded substrate. For example, the cleaning operation may be performed in the filling mode in the upper space S1, and the cleaning operation may be performed in the exhaust mode in the lower space S2.

While embodiments of the present disclosure have been described with reference to accompanying drawings, it is to be understood to those skilled in the art that the present disclosure may be implemented in various forms without departing from the technical concept or essential features of the present disclosure. It is therefore to be understood that the above-described embodiments are illustrative in all aspects and not restrictive.

What is claimed is:

1. A substrate storage apparatus comprising:
    a housing having a loading/unloading port for loading/unloading a substrate and configured to provide a loading space for a loaded substrate;
    a separation membrane coupled to the housing to divide the loading space into a plurality of separation spaces isolated from each other;
    a gas supplier configured to supply a purge gas to the loading space to clean the substrate;
    a gas discharger configured to discharge the purge gas accommodated in the loading space; and
    a controller configured to control supply and discharge of the purge gas for each of the plurality of separation spaces,
    wherein the separation membrane is bounded by a peripheral edge, and wherein the separation membrane is received within the housing such that all gaps between the peripheral edge of the separation membrane and an inner surface of the housing are eliminated, thereby preventing gas movement between the plurality of separation spaces.

2. The substrate storage apparatus of claim 1, wherein a plurality of gas suppliers and a plurality of gas dischargers are provided for each of the plurality of separation spaces, and the controller individually controls the plurality of gas suppliers and the plurality of gas dischargers provided for each of the plurality of separation spaces.

3. The substrate storage apparatus of claim 2, wherein the controller controls the plurality of gas suppliers and the plurality of gas dischargers through one of a filling mode, in which each of the plurality of separation spaces is kept filled with the purge gas, and an exhaust mode, in which each of the plurality of separation spaces is exhausted so that a gas flow is formed for the plurality of separation spaces.

4. The substrate storage apparatus of claim 3, wherein the gas discharger includes a first discharger and a second discharger, and the controller controls such that the purge gas is exhausted through the first discharger and the second discharger in the exhaust mode, and the purge gas is discharged through the first discharger in a state in which discharge of the purge gas through the second discharger is blocked in the filling mode.

5. The substrate storage apparatus of claim 4, wherein each of the first discharger and the second discharger includes:

a gas discharge line configured to provide a transfer path of the purge gas discharged from the loading space;

a gas discharge valve configured to adjust an amount of the purge gas transferred along the gas discharge line; and a discharge port configured to collect the purge gas accommodated in the loading space to guide the purge gas to the gas discharge line.

6. The substrate storage apparatus of claim 5, wherein the gas discharger further includes a third discharger, discharge ports of the first discharger and the second discharger are disposed on an upper surface or a lower surface of the separation space, and a discharge port of the third discharger is disposed on a rear surface of the separation space.

7. The substrate storage apparatus of claim 4, wherein the first discharger is located closer to the loading/unloading port than the second discharger.

8. The substrate storage apparatus of claim 3, wherein the gas suppliers include a first supplier and a second supplier, and the controller controls such that the purge gas is supplied through the first supplier and the second supplier in the filling mode, and the purge gas is supplied through the first supplier in a state in which supply of the purge gas through the second supplier is blocked in the exhaust mode.

9. The substrate storage apparatus of claim 8, wherein the first supplier is located closer to the loading/unloading port than the second supplier.

10. The substrate storage apparatus of claim 8, wherein each of the first supplier and the second supplier includes:

a gas supply line configured to provide a transfer path of the purge gas supplied to the loading space;

a gas supply valve configured to adjust an amount of the purge gas transferred along the gas supply line; and a spray nozzle configured to spray the purge gas transferred through the gas supply line into the loading space.

11. The substrate storage apparatus of claim 3, wherein the controller implements the filling mode or the exhaust mode by adjusting the number of operations of the plurality of gas suppliers and the number of operations of the plurality of gas dischargers provided in each of the plurality of separation spaces.

12. The substrate storage apparatus of claim 1, wherein the separation membrane divides the loading space into an upper space and a lower space.

13. The substrate storage apparatus of claim 1, wherein the separation membrane is attachable to and detachable from the housing.

14. The substrate storage apparatus of claim 1, wherein each of the plurality of separation spaces accommodates substrates that are subjected to the same process or are in the same state.

15. A substrate processing apparatus comprising:

a process module having at least one process unit and configured to perform a manufacturing process on an input substrate;

an index module configured to insert a substrate into the process module and eject the substrate on which the manufacturing process is completed in the process module; and a substrate storage apparatus configured to perform a cleaning operation by loading the substrate inserted into the process module or the substrate ejected from the process module, wherein the substrate storage apparatus includes a housing configured to provide a loading space for the substrate and a separation membrane coupled to the housing to divide the loading space into a plurality of separation spaces isolated from each other for separating and loading substrates having mutually different states, wherein the separation membrane is bounded by a peripheral edge, and wherein the separation membrane is received within the housing such that all gaps between the peripheral edge of the separation membrane and an inner surface of the housing are eliminated, thereby preventing gas movement between the plurality of separation spaces.

16. The substrate processing apparatus of claim 15, wherein the substrate storage apparatus includes:

a gas supplier configured to supply a purge gas into the loading space to clean the substrate;

a gas discharger configured to discharge the purge gas accommodated in the loading space; and a controller configured to control supply and discharge of the purge gas for each of the plurality of separation spaces.

17. The substrate processing apparatus of claim 16, wherein the controller controls the plurality of gas suppliers and the plurality of gas dischargers through one of a filling mode, in which each of the plurality of separation spaces is kept filled with the purge gas, and an exhaust mode, in which each of the plurality of separation spaces is exhausted so that a gas flow is formed for the plurality of separation spaces.

18. The substrate storage apparatus of claim 15, wherein the separation membrane is attachable to or detachable from the housing.

19. The substrate processing apparatus of claim 15, wherein each of the plurality of separation spaces accommodates substrates that are subjected to the same process or are in the same state.

20. The substrate processing apparatus of claim 15, wherein the substrate storage apparatus includes a side storage.

* * * * *